United States Patent
Danner et al.

(10) Patent No.: US 8,875,521 B2
(45) Date of Patent: Nov. 4, 2014

(54) DEVICE AND METHOD FOR COOLING COMPONENTS USING MAGNETIZABLE PHASE-CHANGE MATERIAL

(75) Inventors: Reinhold Danner, Rottenburg (DE); Andre Lischeck, Vaihingen/Enz (DE); Udo Schulz, Vaihingen/Enz (DE); Thomas Proepper, Reutlingen (DE); Heinrich Barth, Leonberg (DE)

(73) Assignee: Robert Bosch GmbH, Stuttgart (DE)

(*) Notice: Subject to any disclaimer, the term of this patent is extended or adjusted under 35 U.S.C. 154(b) by 325 days.

(21) Appl. No.: 13/003,172

(22) PCT Filed: Jun. 10, 2009

(86) PCT No.: PCT/EP2009/057191
§ 371 (c)(1),
(2), (4) Date: Mar. 31, 2011

(87) PCT Pub. No.: WO2010/003755
PCT Pub. Date: Jan. 14, 2010

(65) Prior Publication Data
US 2011/0167838 A1   Jul. 14, 2011

(30) Foreign Application Priority Data
Jul. 9, 2008 (DE) .......................... 10 2008 040 281

(51) Int. Cl.
| | |
|---|---|
| *F25B 21/00* | (2006.01) |
| *F28F 7/00* | (2006.01) |
| *F28F 27/00* | (2006.01) |
| *H01F 5/00* | (2006.01) |
| *H01L 23/373* | (2006.01) |
| *F28D 20/02* | (2006.01) |
| *H01L 23/427* | (2006.01) |
| *F28F 13/16* | (2006.01) |

(52) U.S. Cl.
CPC ............... *F28D 20/02* (2013.01); *Y02E 60/145* (2013.01); *H01L 23/3736* (2013.01); *H01L 23/4275* (2013.01); *F28D 20/028* (2013.01); *F28F 13/16* (2013.01)
USPC .............. 62/3.1; 165/272; 165/80.2; 335/300

(58) Field of Classification Search
USPC .............. 62/3.1, 371, 457.1, 457.2, 530, 434, 62/259.2; 165/104.33, 104.22, 104.23, 165/104.28, 104.13, 104.15, 104.17, 165/104.18, 104.19; 361/699, 700, 704; 335/300; 174/15.1, 15.2
See application file for complete search history.

(56) References Cited

U.S. PATENT DOCUMENTS

| | | | | |
|---|---|---|---|---|
| 3,596,713 | A | * | 8/1971 | Katz ......................... 165/104.13 |
| 4,366,857 | A |   | 1/1983 | Mayer |
| 5,231,834 | A | * | 8/1993 | Burnett ............................ 62/3.1 |

(Continued)

FOREIGN PATENT DOCUMENTS

| | | |
|---|---|---|
| GB | 1 255 331 | 12/1971 |
| WO | WO 2006/114069 | 11/2006 |

(Continued)

OTHER PUBLICATIONS

International Search Report, PCT International Patent Application No. PCT/EP2009/057191 dated Sep. 18, 2009.

*Primary Examiner* — Mohammad M Ali
*Assistant Examiner* — Christopher R Zerphey
(74) *Attorney, Agent, or Firm* — Kenyon & Kenyon LLP

(57) ABSTRACT

A device for cooling components, comprising a housing in which a cavity is formed, in which a phase-change material is accommodated, the housing having at least one surface, which is able to be brought into contact with the component to be cooled, and at least one heat-dissipating surface. The cavity accommodating the phase-change material is enclosed by at least one coil, and the phase-change material includes ferromagnetic or magnetizable particles. Furthermore a method for cooling a component using the device is described.

4 Claims, 9 Drawing Sheets

(56) References Cited

U.S. PATENT DOCUMENTS

| | | | |
|---|---|---|---|
| 6,052,992 A | 4/2000 | Eroshenko | |
| 6,708,501 B1 * | 3/2004 | Ghoshal et al. | 62/3.7 |
| 7,069,979 B2 * | 7/2006 | Tobias | 165/104.33 |
| 7,149,083 B2 * | 12/2006 | Hsu | 361/697 |
| 7,245,495 B2 * | 7/2007 | Ouyang | 361/701 |
| 2002/0046825 A1 * | 4/2002 | Huang et al. | 165/80.4 |
| 2002/0053418 A1 | 5/2002 | Hirano | |
| 2002/0164277 A1 | 11/2002 | Tobias | |
| 2004/0093877 A1 | 5/2004 | Wada et al. | |
| 2008/0029247 A1 | 2/2008 | Nozaki et al. | |
| 2008/0062648 A1 | 3/2008 | Gilliand | |

FOREIGN PATENT DOCUMENTS

| | | |
|---|---|---|
| WO | WO 2007/075130 | 7/2007 |
| WO | WO 2010/003755 | 1/2010 |

\* cited by examiner

DEVICE AND METHOD FOR COOLING COMPONENTS USING MAGNETIZABLE PHASE-CHANGE MATERIAL

FIELD OF THE INVENTION

The present invention is based on a device and method for cooling components.

BACKGROUND INFORMATION

Components that need to be cooled are, for instance, compact electronic subassemblies having highly-integrated circuits (ASICs), and digital microcontrollers in which high power-loss densities could occur. When the electrical power consumption is high and, in particular, when transient load states occur, highly integrated electronic circuits may heat up very quickly due to the unavoidable Ohmic and dielectric losses. However, excessively high internal temperatures at the pn-junctions of the semiconductors can lead to malfunctions, premature ageing and breakdown of the entire subassembly, which is why the internal thermal energy must be dissipated to the system environment.

The heat dissipation takes place by passive diffusion cooling, for example, or by the technically complex convective coolant recirculation with the aid of turbo or positive-displacement pumps. The recirculated coolant fluid absorbs heat at the hot surface of a component and transmits it to a heat transfer element having a large surface. Normally, the surface of the heat transfer element has thin lamellae or ribs on the system surface. A media flow along the external surface has an advantageous effect that counteracts the boundary layer effects hindering the heat transfer.

A heat transfer takes place at a surface having a higher temperature to a surface having a lower temperature. When a thermal equilibrium is present, no energy exchange with the system environment occurs.

In addition to diffusion cooling and convective cooling, electrical cooling via Peltier elements is known also available. However, these elements are relatively expensive, increase the electrical power consumption of the electronics, and possibly use more space themselves than the electronic components to be cooled. For this reason, Peltier elements are not an option for wide-spread use.

In addition to convective coolant recirculation with the aid of turbo or positive-displacement pumps, passive coolant recirculation according to the principle of self-maintaining convection in the form of so-called thermo-siphons is also used. However, this presupposes an orientation of the heat flow parallel to the gravitational field. In computer electronics, heat pipes, which likewise operate according to the principle of passive coolant recirculation, are also used for cooling. A heat pipe is a hermetically sealed system for the transfer of heat by evaporative cooling and self-maintaining coolant convection. The boiling-point temperature of a coolant used in a heat pipe lies in the thermal operating range of a heat source to be cooled. The liquid phase wets the inner wall of a thin pipe, and the gaseous phase, driven by the gas pressure in the interior of the pipe, is able to flow to the heat sink and dissipate the evaporation heat to a heat exchange element there. The vapor condenses in the process. The fluid wets the internal walls of the pipe and flows back to the heat source propelled by the capillary effect. To enhance the flow based on the capillary effect, the inner wall of the heat pipe is usually provided with a capillary structure.

However, when thermal contact to the system environment is technically not feasible or not desired, latent heat stores, which absorb the heat from a heat source, may be used. This is particularly advantageous if transient thermal power peaks in the load profile of the application must be intercepted. For example, in a temporary rapid increase in the ambient temperatures, e.g., while driving slowly or while the vehicle is standing following a longer operating period in the full-load state of the engine, cooling by diffusion or air convection of electronic control devices in an engine compartment of a motor vehicle may possibly no longer be sufficient. In this case the advantages of latent heat storage come to bear. Instead of transmitting the lost heat to the system surface, for instance by diffusion or coolant convection, the heat is dissipated to a phase-change material PCM. In the coexistence range of the solid and fluid phases, as well as the in liquid and gaseous phases of a PCM, heat input does not lead to an increase in temperature, but to a change in entropy in the change of the state of aggregation or in the degree of order, for example, by a reduction of the magnetic polarization or the loss of the crystalline long-range order.

In a phase change due to the absorption of heat or the dissipation of heat, the temperature of the PCM remains generally constant. However, in the boundary layer to the heat source, the local temperature of the liquid phase, for example, may become higher than the melting temperature as the layer thickness increases, due to its poorer thermal conductivity in comparison with the solid phase. A temperature gradient forms between the solid phase and the component to be cooled.

Latent heat stores containing a phase-change material which are employed for cooling are described in PCT Application No. WO-A 2007/075130 and U.S. Published Patent Application No. 2002/0164277, for example.

SUMMARY

An example device for cooling components according to the present invention includes a housing inside which a cavity is formed in which a phase-change material is accommodated. The housing has at least one surface that is able to be brought into contact with the component to be cooled, and at least one surface that dissipates heat. The cavity holding the phase-change material is enclosed by at least two coils, and the phase-change material includes ferromagnetic or magnetizable particles.

The example device is especially suitable for dissipation and latent storage of the heat losses of electronic or mechanical apparatuses. For example, the device may be used to cool and stabilize the temperature of electronic control devices in motor vehicles, in particular during operation with transient thermal load peaks and a simultaneous base load. For example, these peaks occur during a regeneration operation of Diesel particulate filters having a plurality of electronically controlled post-injections of the engine, or following longer operation in the full-load range of the motor and subsequent slow driving or stop-and-go driving while high temperatures are prevailing in the engine and poor air convection exists at the same time.

The example device is used especially for latent storage and for the simultaneous transfer of heat losses. According to an example method for cooling a component, the latent storage and the transfer of heat losses are implemented with the aid of the device. The example method includes the following steps:
(a) Generating a magnetic field in the phase-change material by energizing the coils,
(b) Melting a portion of the phase-change material by heat absorption on the side facing the component to be cooled;

(c) Reversing the magnetic field by reversing the direction of the energization of the coils and rotating the portion of the phase-change material not melted, thereby causing the molten phase-change material to be moved toward the heat-dissipating surface and solid phase-change material to be moved toward the surface at which the heat is absorbed;

(d) Melting a portion of the solid phase-change material facing the component to be cooled, and oriented solidification of the liquid phase-change material facing the heat-dissipating surface in the magnetic field of the coils;

(e) Repetition of steps (c) and (d), if called for.

Because of the coils and the ferromagnetic or magnetizable particles contained in the phase-change material, which make it possible for the not molten portion of the phase-change material to be rotated by reversing the direction of energization of the coils and the resulting reversed magnetic field, the example device according to the present invention is operating as latent heat store on the one hand, and as magnetically driven, wear-free positive-displacement pump whose rotary piston is made of the solid phase of the phase-change material and which operates without additional mechanical parts, on the other. Through periodic melting and oriented solidification in the power cycle, the rotary piston reworks itself over and over. The example device may be used in applications, for example, that do not allow a recirculation of fluid or gaseous coolant media driven by positive-displacement or turbo pumps. It is also possible to configure the device to an average thermal power loss for use with a transient load profile, since lost heat is transferred as well as latently stored at the same time. There is no need to provide for the usually rarely occurring borderline case, as must be done in passive diffusion cooling.

Another advantage consists of the fact that the example device operates without noise and is resistant to mechanical and chemical actions and also does not have any elements exhibiting wear. In addition, the required electrical power consumption for rotating the solid portion of the phase-change material, which is acting as positive-displacement piston and has a magnetic orientation, is very low.

Another advantage is that pumps, hose connections, compression packing or screw connections, which have to be provided for convective cooling systems, are not required. The phase-change material is hermetically sealed inside a solid housing. Given appropriate internal-pressure stability of the housing, the liquid phase and the gaseous phase of the phase-change material are unable to leave the housing.

By corresponding control of the coils for reversing the magnetic field, the transition from latent heat storage to heat transfer is able to be controlled and regulated in a smooth manner. Both processes may run simultaneously. Since only a thin fluid layer is situated between the heat source and the solid phase of the phase-change material as heat-flow barrier, a high transfer heat flow is ensured at all times.

Because of the ferromagnetic or magnetizable particles contained in the phase-change material, the example device also absorbs thermal energy from an increase in entropy in addition to the heat of melting, in that the magnetic order of the ferromagnetic or magnetizable particles contained in the phase-change material is reduced by fusion.

Another advantage of the ferromagnetic or magnetizable particles in the phase-change material is that the heat absorbed or dissipated by melting and solidification, respectively, and the discharged and incoming heat flows are able to be measured in a simple and precise manner via an attendant change in the magnetization of the phase-change material, based on the change in the coil inductivities. In addition, the temperature of the heat sink and the heat source may be determined from the heat flow balance and known thermal material parameters of the housing and the phase-change material. The clock rate of the recirculation cycle is controlled with the aid of these quantities, thereby ensuring that sufficient solid phase of the phase-change material is always available in the immediate environment of the heat source, and that a high heat flow is maintained at the heat source.

In order to ensure the recirculation of the phase-change material, it is preferred if the cavity which holds the phase-change material has a circular cross-section. The two coils, which enclose the cavity containing the phase-change material, are preferably aligned relative to each other such that the magnetic fields generated by the coils may have the same orientation. The coils are preferably disposed in such a way that one coil is situated above a center plane of the cavity, and the other coil is situated below the center plane of the cavity. This placement of the coils makes it possible to realize the rotation of the unmelted, magnetically oriented portion of the phase-change material with the aid of appropriate control and alignment of the magnetic field.

In one specific embodiment, in order to increase the latent-heat storage capacity, it is possible to place at least two cavities containing phase-change material one after the other in the transport direction of the heat. In the process, the phase-change material situated in each cavity is able to absorb heat and store it. By rotation and subsequent solidification, the heat is then dissipated again. If a large surface has to be cooled, it is also possible to place a plurality of cavities containing phase-change material next to each other. Even in the case of non-planar surfaces, this makes it possible to achieve a placement that ensures optimum cooling, since in the case of adjacently disposed cavities in which phase-change material is contained, the cavities may also be placed at different levels and thus be adapted to the surface of the component to be cooled.

In order to save space and avoid damage to the coil, it is preferred if the coils are accommodated inside the housing. As an alternative, however, it is also possible to place the coils outside of the housing, for instance.

In addition to cooling and temperature stabilization of electronic control devices in motor vehicles, the device for cooling components is also suitable for cooling compact, integrated electrical, micromechanical, and electronic subassemblies, which heat up rapidly due to the low mass and heat capacity of the subassembly at thermal load peaks, and which leave no room for driven convection cooling systems, or are unable to provide sufficient electric drive output and/or do not allow for a heat transfer to the immediate system environment due to a thermally unfavorable installation location or structural marginal conditions. Heat transfer to the immediate system environment is impossible, for example, when increased ambient temperatures or mechanical stresses exist temporarily, or when thermal conduction is insufficient due to high thermal transfer resistances. In addition to the electronic control devices in motor vehicles, this also applies to control computers in the immediate vicinity of production, processing or machine systems, for example.

If heat is able to be dissipated across a plurality of surfaces of the housing, then the device may also be used as heat shunt, which can redirect and distribute the heat flow emitted by the heat source, i.e., the component to be cooled, to different heat sinks. The distribution may be controlled or regulated in a continuous manner.

In order to rotate the molten phase-change material in the direction of a heat dissipating surface by rotating the portion of the phase-change material that has not been melted, at least two coils are preferably aligned relative to each other in such a way that the magnetic field in the phase-change material generated by the coils is able to be aligned perpendicular to the heat-dissipating surface. The rotation is performed to the point where the ferromagnetic or magnetizable particles contained in the phase-change material are aligned in the direction of the magnetic field lines of the magnetic field generated by the coils.

According to an example embodiment of the present invention, the heat transfer from the heat source to the heat sink is controlled via the clock frequency of the recycling cycle of the liquid phase of the phase-change material, and regulated via the inductive determination of the heat-flow balance. If the device is used for cooling electronic subassemblies, then the coils may be used in voltage converters, EMC throttles, or as inductivities featuring a coil core with variable magnetization.

BRIEF DESCRIPTION OF THE DRAWINGS

Exemplary embodiments of the present invention are shown in the figures and explained in greater detail below.

DETAILED DESCRIPTION OF EXAMPLE EMBODIMENTS

Figure 1:
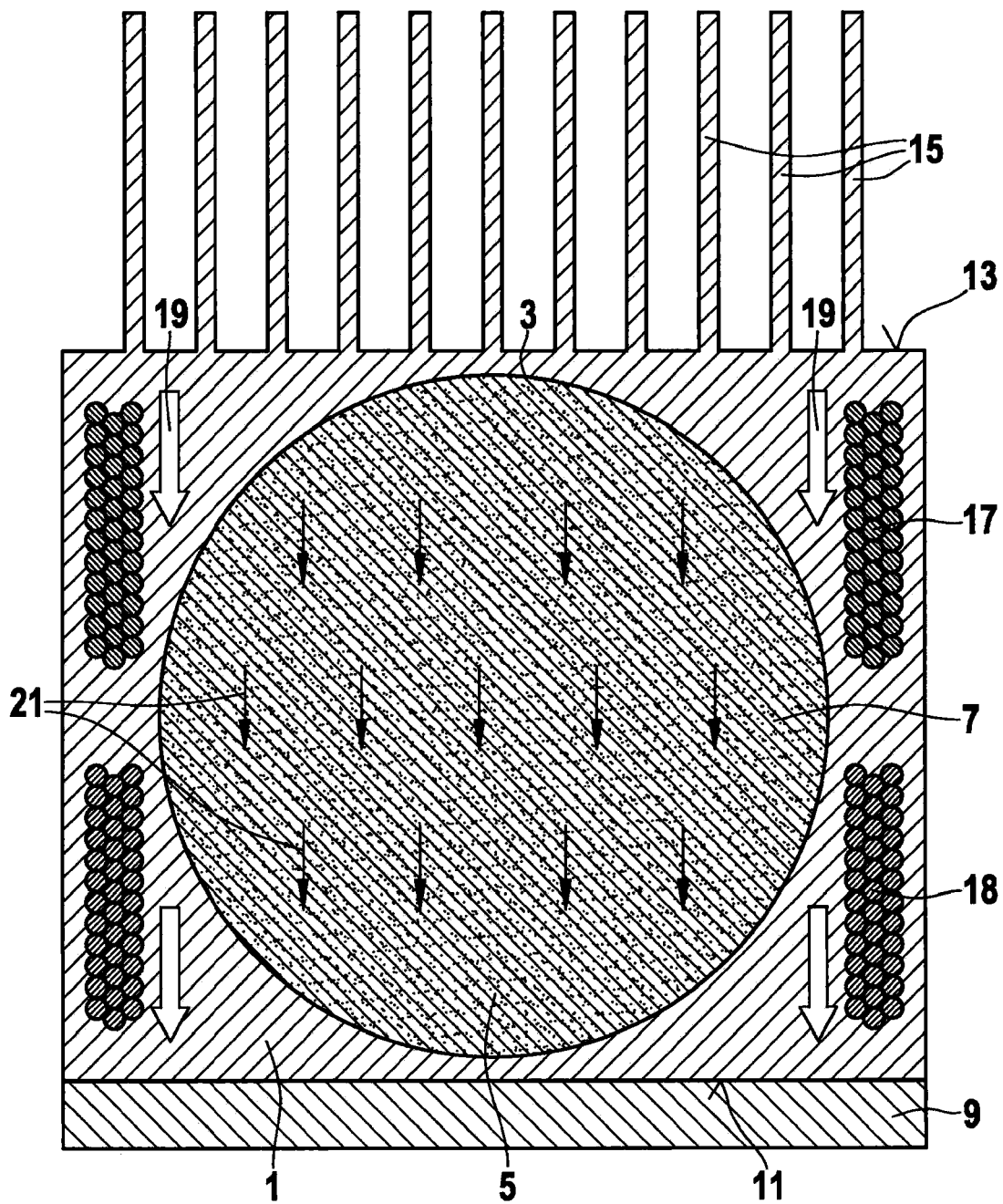
FIGS. 1-6 shows method steps for cooling a component using a device, in a first specific embodiment.

In FIGS. 1 through 6, a method for cooling components in a device for cooling components is shown in a first specific embodiment.

An example device designed for cooling components according to the present invention includes a housing 1, which made of a material having excellent thermal conductivity. Metal materials are particularly suitable for housing 1. Especially suitable is copper or aluminum, for example. A cavity 3 is formed in the housing. In the specific development illustrated here, cavity 3 has a circular cross-section. Cavity 3 developed with a circular cross-section may be in the shape of a cylinder, a ball, or also have a conical form or the form of a truncated cone. Preferably, however, cavity 3 is spherical or cylindrical. Contained in cavity 3 is a phase-change material 5. Employed phase-change material 5 is a function of the temperature of the component to be cooled. For example, paraffin, waxes, grease, fatty acids, metal alloys such as bismuth-lead alloys, or salts having a low melting point are suitable phase-change materials. Which phase-change material is suitable for which temperature range is well known. Phase-change material 5 includes ferromagnetic or magnetizable particles 7.

A surface 9 to be cooled of a component to be cooled is resting against a surface 11 of housing 1. In order to achieve optimum heat transfer from the component to be cooled to housing 1, it is advantageous if no gaps form between surface 9 to be cooled of the component to be cooled, and surface 11 of housing 1. To achieve uniform contact, it is possible, for example, to introduce a heat-conduction paste between surface 9 to be cooled of the component to be cooled, and surface 11 of housing 1.

In addition to surface 11 of housing 1, which contacts surface 9 to be cooled of the component to be cooled, housing 1 includes at least one heat-dissipating surface 13. In order to enlarge heat-dissipating surface 13, ribs 15 are preferably developed on heat-dissipating surface 13. Ribs 15 may be made from the same thermally conductive material as the housing. As an alternative, ribs 15 may also be made from a material that differs from the housing material, but which likewise has excellent thermal conductivity.

Cavity 3 containing phase-change material 5 is enclosed by at least one coil 17. In the specific development shown here, cavity 3 is enclosed by two coils 17. One coil 17 is situated above a center line of cavity 3, and a second coil 17 is situated below the center line of cavity 3. When a voltage is applied to coils 17, a magnetic field is generated. Coils 17 are initially switched in such a way that the magnetic field generated by coils 17 in cavity 3 containing phase-change material 5 is equidirectional. The magnetic field generated by coils 17 is indicated by arrows 19. The magnetic fields generated by coils 17 may be equidirectional or contradirectional. In the specific embodiment shown here, magnetic fields 19 of coils 17 are equidirectional.

At the beginning of the heat dissipation from surface 9 to be cooled of the component to be cooled, phase-change material 5 is present as solid phase. The ferromagnetic or magnetizable particles contained in phase-change material 5 are oriented along the field lines of magnetic field 19. In order to achieve the orientation of ferromagnetic or magnetizable particles 7, phase-change material 5 solidifies in magnetic field 19 of coils 17. The orientation of particles 7 is indicated by arrows 21.

Any ferromagnetic or paramagnetic material having positive magnetic susceptibility is suitable as material for the ferromagnetic or magnetizable particles. Suitable materials are, for example, iron-nickel alloys, iron-aluminum-nickel-cobalt alloys or bismuth-manganese alloys. Ferromagnetic or magnetizable particles 7 are preferably present in the form of micro-particles having an average particle diameter of generally less than 1 μm.

In one preferred specific embodiment, the particles contained in phase-change material 5 are ferromagnetic. In this case, phase-change material 5 is residually magnetized in the solid phase.

Figure 2:
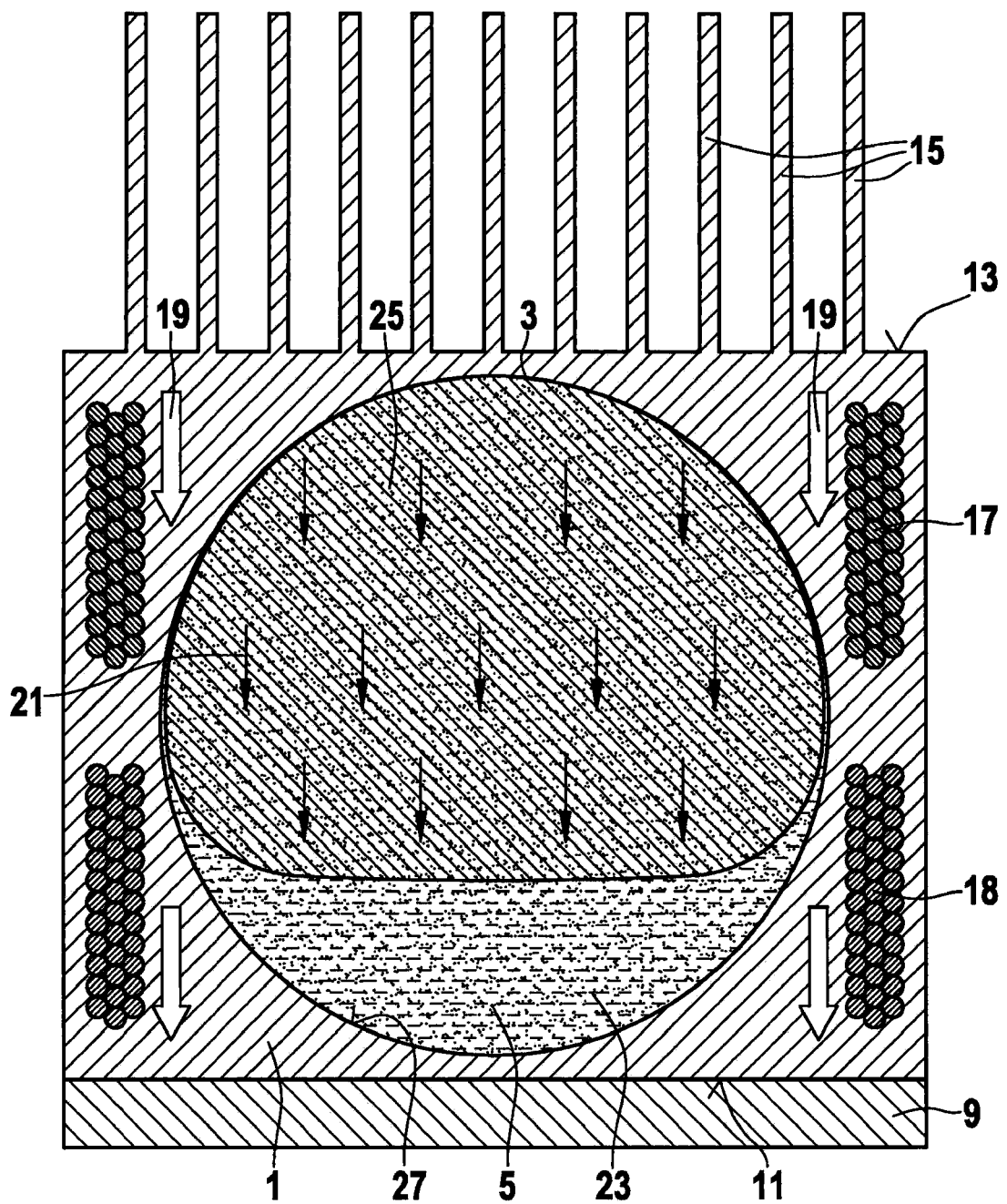
Figure 3:
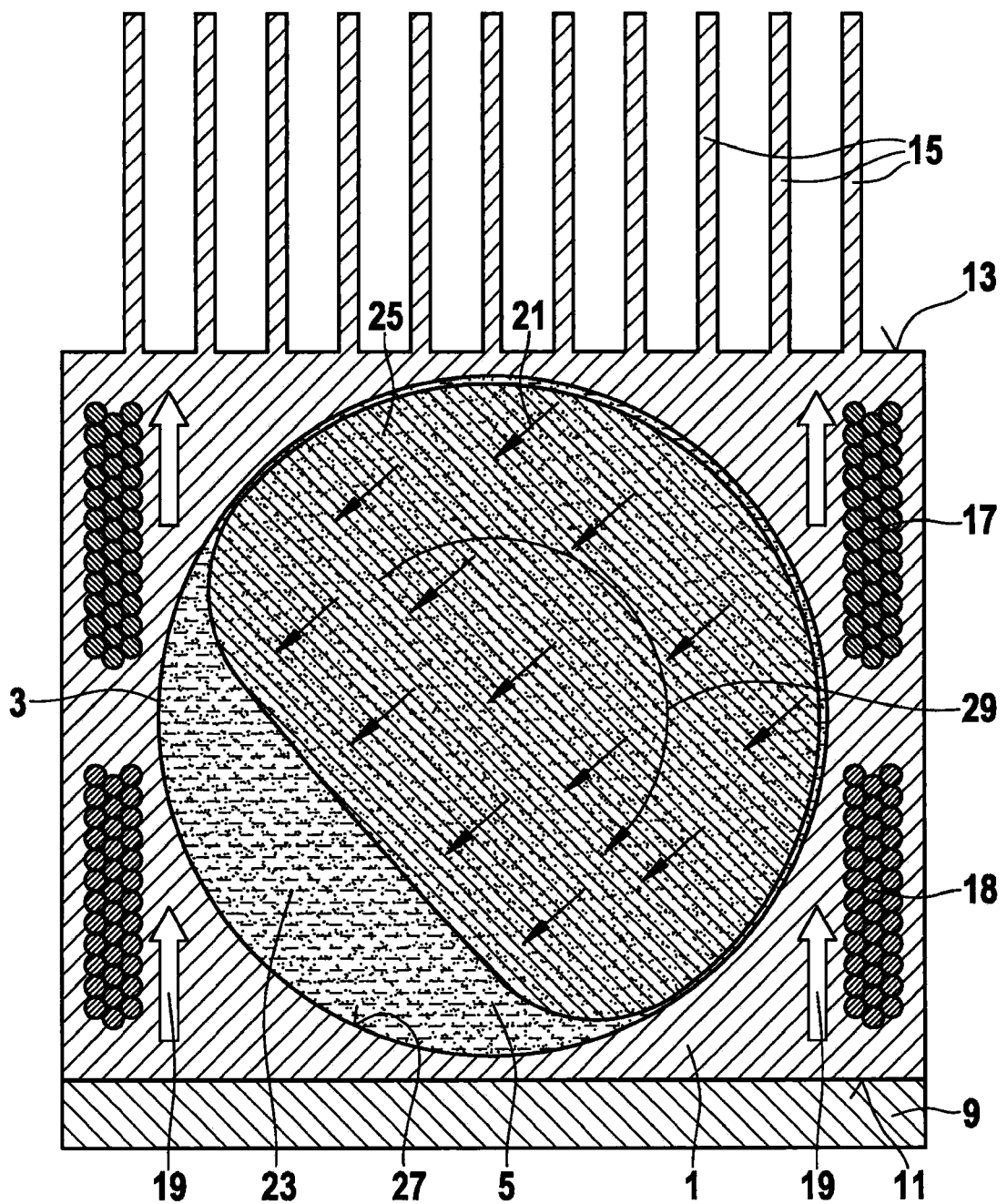
Figure 4:
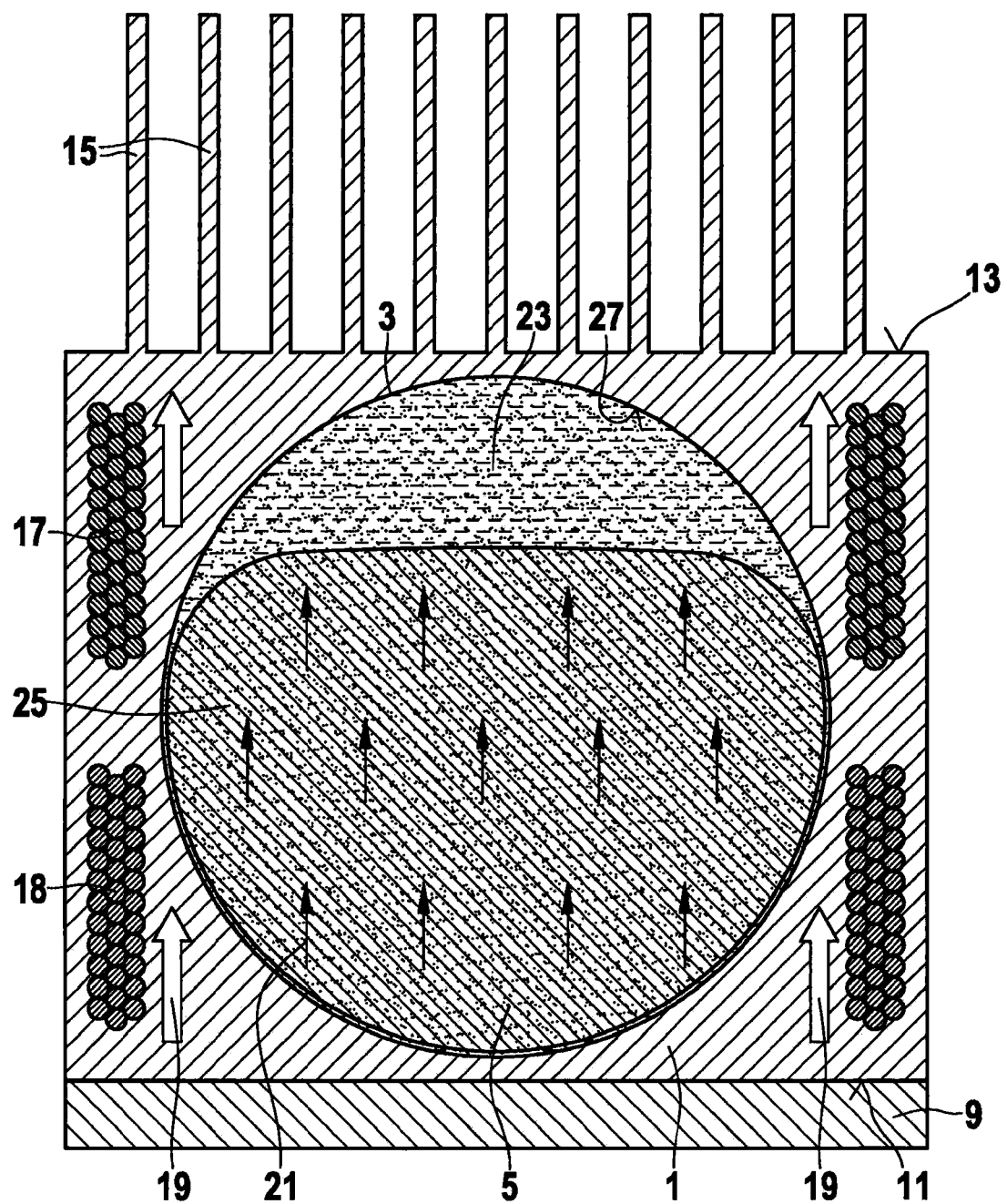

Through the contact between surface 9 to be cooled of the component to be cooled, and surface 11 of housing 1, heat is transmitted from the component to be cooled to housing 1 and, by thermal conduction, through housing 1 to phase-change material 5. Phase-change material 5 begins to melt as soon as the melting temperature of the phase-change material has been reached. The melting causes the phase-change material to absorb heat from the component to be cooled. On the side pointing toward surface 9 to be cooled, phase-change-material 5 transitions into liquid phase 23 due to the melting. Remaining solid phase 25 of phase-change material 5 forms an eccentric rotary piston which, in conjunction with coils 17 in the form of a cyclically operating, magnetically driven displacement pump, by rotation moves phase-change material 5 in liquid phase 23 from surface 9 to be cooled in the direction of heat-dissipating surface 13. This process is illustrated in FIGS. 2, 3, and 4.

The melting phase-change material usually expands, and liquid phase 23 pushes between solid phase 25 of phase-change material 5 and wall 27 of cavity 3. In order to overcome the adhesion of solid phase 25 to wall 27 of cavity 3 in the region of heat-dissipating surface 13 and to completely detach the rotary piston formed by solid phase 25 from wall 27 of cavity 3, coil 18 facing surface 9 to be cooled is used for exciting a preferably pulsating magnetic field that is equidirectional with the dipole moment of the phase-change material, and coil 17 facing toward heat-dissipating surface 13 is used for exciting a preferably pulsating magnetic field that is contradirectional. A slight, temporal pulsation of the field strength facilitates the detachment from wall 27 of cavity 3 and the overcoming of the top and bottom dead center of the torque in magnetic field 19. This frees solid phase 25 as rotary piston of the circulating pump from wall 27 of cavity 3, so that it is now able to rotate within the fluid film wetting entire wall 27 of cavity 3. This rotation is indicated by arrow 29 in FIG. 3. Because of the rotation of solid phase 29, liquid phase 23 of the phase-change material is moved in the direction of heat-dissipating surface 13. For rotation 29 of solid phase 25, magnetic field 19, which is generated by coils 17, 18, is rotated by 180° with respect to the original direction. This causes magnetic field 19 to be opposed to the initial field.

Rotation 29 of solid phase 25 is initiated as soon as the inductively determined melted volume of phase-change material 5, and thus the arriving heat quantity, has reached a specified value. This value is determined via a control system, which is not shown here. As soon as this value has been reached, the equidirectional fields of coils 17, 18 are reversed. The dipole moment of the phase-change material thus is situated anti-parallel to the magnetic equidirectional field, to which a slight temporal pulsation of the field strength is superimposed in order to deflect the rotary piston formed by solid phase 25 of phase-change material 5 from the unstable dead point of the torque in the magnetic field. Solid phase 25 now rotates into the opposite-lying, stable dead point in which its dipole moment is situated parallel to the field. This shifts liquid phase 23 of phase-change material 5 into the region of heat-dissipating surface 13. The torque to which magnetized solid phase 25 of phase-change material 5 is subjected depends on the angular position of solid phase 25, and thus on the orientation of particles 21 as well as the strength of the dipole moment of magnetized solid phase 25 of the phase-change material. The drive operates like a switched reluctance motor.

As soon as solid phase 25 of phase-change material 5 has completed half of a rotation, liquid phase 23 is situated on the side facing heat-dissipating surface 13. The orientation of particles 7 in solid phase 25 corresponds to the direction of magnetic field 19 again. Solid phase 25 is in a stable position, and the rotation of solid phase 25 is completed. This is illustrated in FIG. 4.

Figure 5:
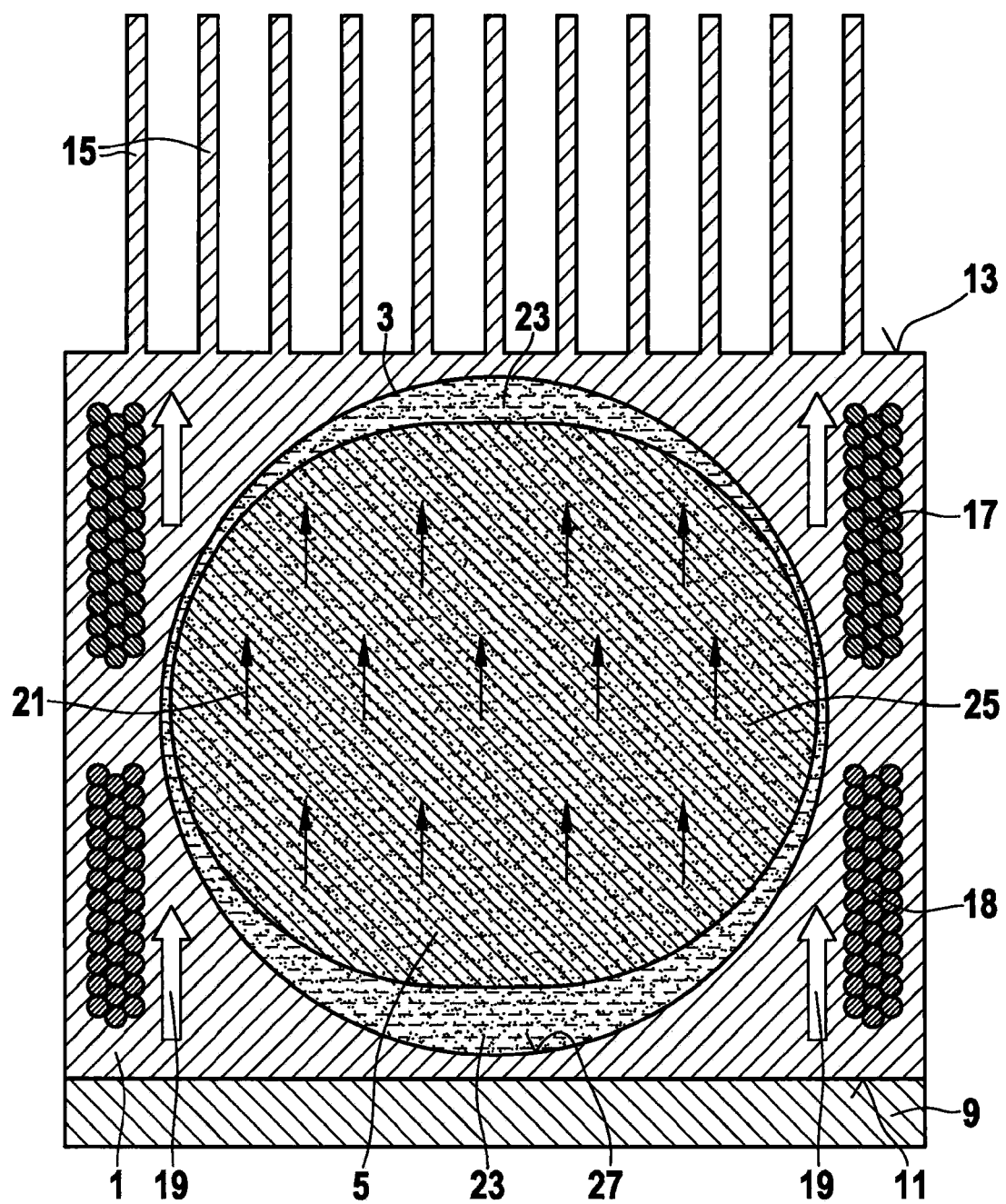

As soon as solid phase 25 has reached this stable position, liquid phase 23 of phase-change material 5 dissipates heat via heat-dissipating surface 13 and ribs 15. Toward this end it is possible, for one, to expose heat-dissipating surface 13 and ribs 15 to a flow of coolant, but usually the heat is dissipated to the environment. This heats the ambient air, and the heat is carried away by free convection. The heat dissipation causes liquid phase 23 to solidify. Because of magnetic field 19 produced by coil 17, which encloses liquid phase 23 of phase-change material 5, the particles contained in liquid phase 23 of phase-change material 5 align in the magnetic field. As a result, the solidified phase-change material continues to maintain an oriented magnetization. In addition to the latent melting heat of phase-change material 5, particles 7 emit thermal energy to heat-dissipating surface 13 and ribs 15 due to the orientation caused by the phase transition into the original state of lower entropy. Simultaneously with the solidification of phase-change material 5 on the cooled side, heat from surface 9 to be cooled of the component to be cooled is transmitted via surface 11 of housing 1, which is connected to surface 9 to be cooled of the component to be cooled in thermally conductive manner, the heat being transmitted to solid phase 25 of phase-change material 5. The solid phase of the phase-change material begins to melt. This is illustrated in FIG. 5. When phase-change material 5 has absorbed precisely the same amount of heat as is able to be emitted at heat-dissipating surface 13, the volume of solidified phase-change material 5 corresponds to the volume of molten phase-change material 5. If the heat is able to be dissipated to the environment more rapidly than it is absorbed by the phase-change material, then the solidification process has come to an end before the same amount of phase-change material 5 has melted again.

Maintaining solid phase 25 of phase-change material 5 in the stable position requires only a low coil current of coils 17, 18. It is also sufficient for the alignment of the ferromagnetic or magnetizable particles 7 contained in phase-change material 5 during the solidification process. Because of the increasing solidification of the phase-change material by heat dissipation, the magnetization of solid phase 25 of phase-change material 5 increases until a steady-state maximum value is reached. The inductivity of coil 17 facing heat-dissipating surface 13 likewise attains a steady-state maximum value. At the same time, the inductivity of coil 18 facing surface 9 to be cooled decreases due to the melting of phase-change material 5 and the attendant increase in volume of liquid phase 23 on the side surface 9 to be cooled. The reason for this is the reduction in the magnetic polarization in liquid phase 23 of phase-change material 5, which leads to a reduction in the volume of solid phase 25 having an oriented magnetization. The change in the inductivities of coils 17, 18 is determined very precisely in a conventional manner with the aid of an inductive Wheatstone bridge circuit, for example, as well as an electronic measuring generator in control electronic. Using a control unit, e.g., an electronic control computer, a two-dimensional or three-dimensional, simplified thermal diffusion model is numerically simulated as a function of the shape of cavity 3 and housing 1, based on Fick's law. With the aid of this model, the incoming and the discharged heat flow are determined from the inductively determined solidification and melting rate of phase-change material 5; and with the aid of the known starting temperature of phase-change material 5 and housing 1, the temperature of surface 9 to be cooled as well as surface 13 and ribs 15, via which heat is able to be dissipated, and the absorbed thermal energy are calculated.

In addition to the use of an inductive Wheatstone bridge circuit and an electronic measuring generator for ascertaining the inductivities of coils 17, 18, however, it is also possible to perform an analog-digital conversion of the measured coil currents when an AC voltage having a specific amplitude and frequency is applied.

In a cavity 3 having a cylindrical form, it is generally sufficient to use a two-dimensional diffusion model for the simulation. In contrast, in a spherical cavity 3 and thus a spherical shape of solid phase 25 having the form of a rotating piston, a three-dimensional diffusion model is required.

Depending on the required precision and the available computing capacity of the control unit, the diffusion model may also take the thermal expansion coefficient of phase-change material 5 into account as well as the thermal transition resistances of the boundary layers between housing 1, solid phase 25, and liquid phase 23, in addition to the thermal capacity and thermal conductivity of the material of housing 1 and the states of aggregation of phase-change material 5.

Because of the melting of phase-change material 5, particles 7, which initially are present in solid phase 25 in oriented manner, transition from the ordered state having low entropy into a random state of higher entropy. This increase in entropy removes additional thermal energy from the component to be cooled, via surface 9 to be cooled. In one preferred specific embodiment, ferromagnetic or magnetizable particles 7 have such low expansion that their magnetic orientation in liquid phase 23 of phase-change material 5 is statistically evenly distributed in thermal equilibrium with the Brownian motion of the molecules, and the magnetization of phase-change material 5 in the liquid phase 23 disappears as a result.

Figure 6:
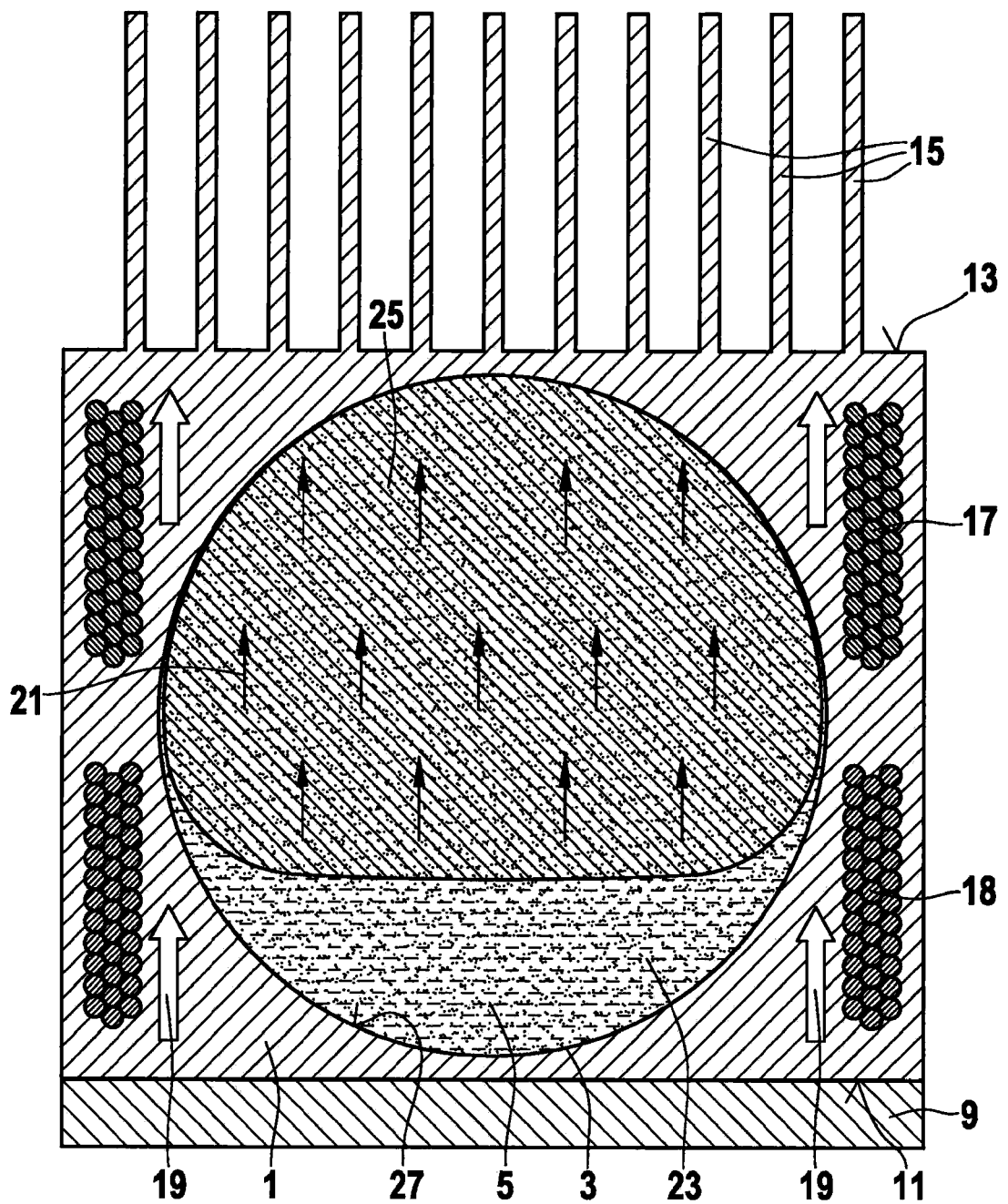

As soon as the liquid portion of phase change material 5 facing heat-dissipating surface 13 has solidified and the quantity of liquid phase 23 facing surface 9 to be cooled once again corresponds to the previously melted quantity, as shown in FIG. 6, the magnetic field of coils 17, 18 is reversed once again, possibly using pulsation, so that solid phase 25 rotates anew and melted liquid phase 23 once again is moved back toward heat-dissipating surface 13.

Figure 7:
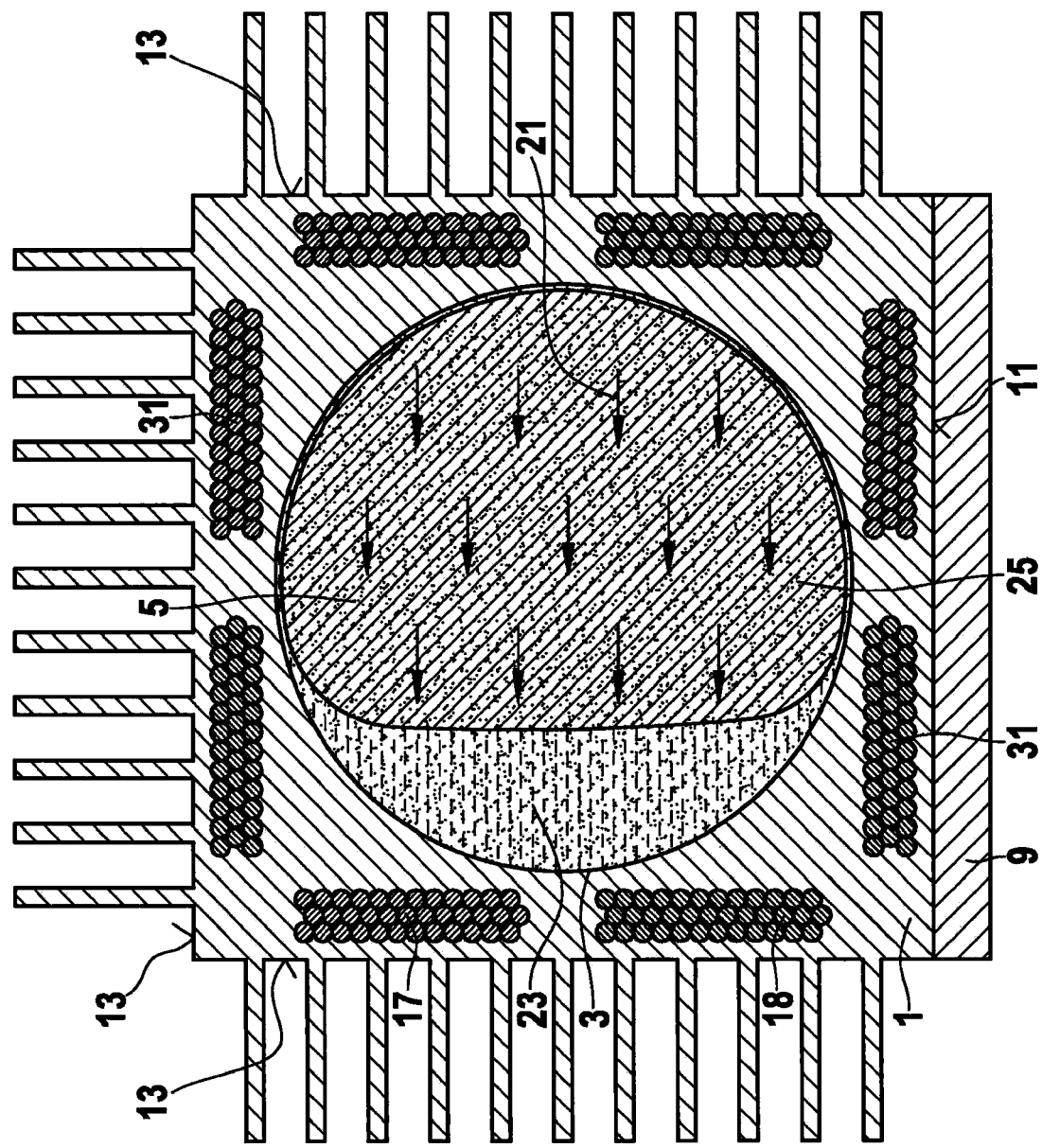
FIG. 7 shows a second specific embodiment of a device for cooling components.

If the melting rate of phase-change material 5 is higher than the solidification rate, then more heat flows into cavity 3 containing phase-change material 5 than is being dissipated by it again. This state is detected via the inductivities of coils 17, 18. To ensure that the rotary piston formed by solid phase 25 of phase-change material 5 does not melt to such a degree that its eccentric form is lost and the rotation of solid phase 25 no longer produces sufficient recirculation of liquid phase 23, the frequency of the circulation cycle is increased according to the numerically simulated dynamic diffusion model, and the heat transfer flow is increased thereby as well. As an alternative, it is also possible to achieve additional heat dissipation from the phase-change material to the environment by providing housing 1 with more than one heat-dissipating surface 13. This is shown in FIG. 7 for three heat-dissipating surfaces 13 by way of example. Here, the heat-dissipating surfaces 13 each have ribs 15 in order to enlarge the surface. In this case, heat from phase-change material 5 is emitted to the environment at each heat-dissipating surface 13, while at the same time heat is absorbed by surface 9 to be cooled of the component to be cooled during the heat-dissipation. In order to also achieve a stable orientation of the phase-change material relative to the further heat-dissipating surfaces 13, additional coils 31 are provided, which are situated perpendicular to coils 17, 18.

However, in addition to the illustrated placements of coils 17, 18 and 31, any other placement of the coils known to one skilled in the art, by which a rotation of solid phase 25 in cavity 3 is able to be brought about, may be used as well.

Figure 8:
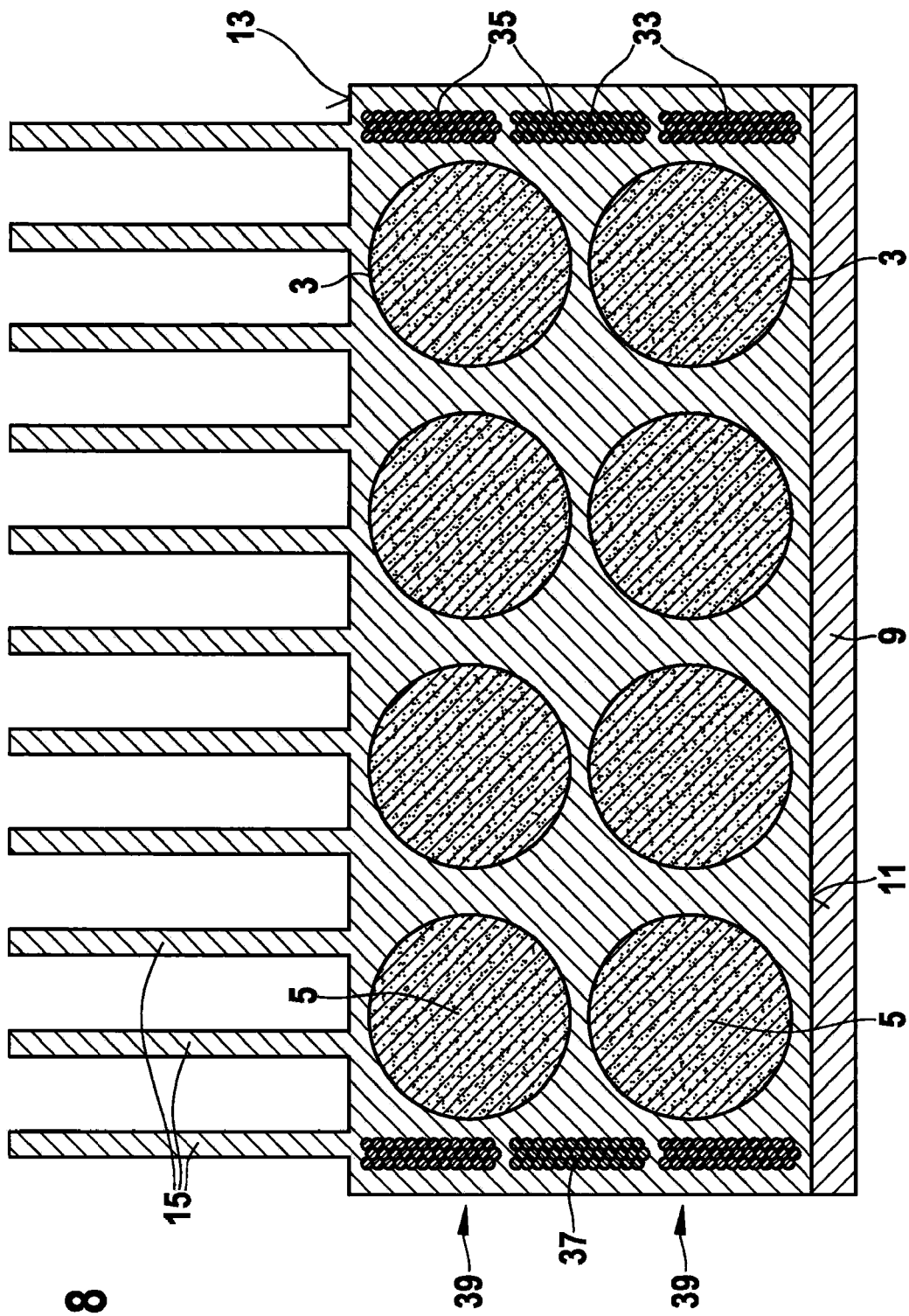
FIG. 8 shows an example device for cooling components having a plurality of cavities connected in parallel and in series and filled with phase-change material.

FIG. 8 shows an alternative specific development of a device for cooling components according to the present invention.

In the specific embodiment shown in FIG. 8, a plurality of cavities is disposed in housing 1 one after the other and in parallel with each other. This allows heat to be dissipated from a larger surface. To achieve the required rotation of solid phase 25, it is possible to provide coils for each cavity on the one hand, but alternatively, it is preferred if all cavities 3 lying in a row in each case are enclosed by a common pair of coils 33, as illustrated in FIG. 8. It is preferred if a first pair of coils 33 and a second pair of coils 35, which enclose adjacently disposed cavities 3 in each case, have a shared coil 37. In one arrangement, as shown in FIG. 8, in which a plurality of cavities 3 containing phase-change material 5 are disposed next to each other and in series, it is preferred if the phase-change material of each row 39 has the same melting temperature, but phase-change material 5 of consecutive rows 39 has different melting temperatures. The melting temperatures preferably decrease from surface 9 to be cooled toward heat-dissipating surface 13. This produces a high latent-heat storage capacity and, in the steady-state operating state of the device, a high heat transfer flow comes about between surface 9 to be cooled of the component to be cooled and heat-dissipating surface 13.

Figure 9:
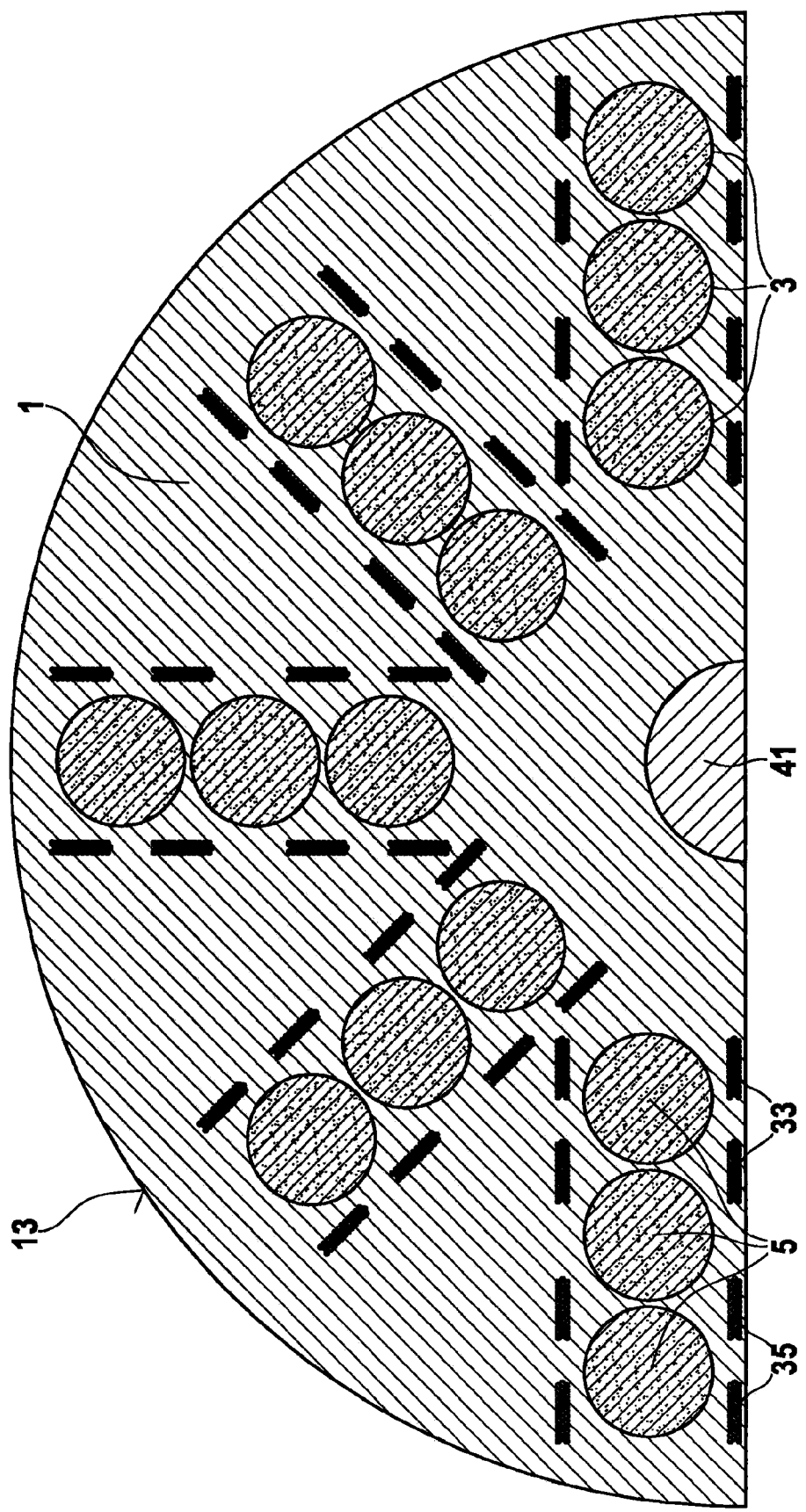
FIG. 9 shows a second specific development of a device for cooling components having a plurality of cavities containing a phase-change material, the cavities being connected in parallel and in series.

One further alternative specific development featuring a plurality of cavities 3 situated in series and next to each other is shown in FIG. 9. In this case, cavities 3 are disposed in the form of a circle in a housing 1 around a component 41 to be cooled. The component to be cooled also has a circular surface. This may be a spherical surface, for instance, or a circular-cylindrical surface. For example, component 41 may also be developed as hemispherical shape. In the specific development shown in FIG. 9 it is also preferred if phase-change material 5, which is contained in cavities 3 switched in series, has different melting temperatures, the melting temperature of the phase-change material decreasing from component 41 to be cooled toward heat-dissipating surface 13.

Because of the placement of cavities 3 in housing 1, the specific development shown in FIG. 9 requires that each cavity 3 be enclosed by a pair of coils 33, 35. If three cavities 3 are disposed one after the other as shown in FIG. 9, it is possible that one coil of first pair of coils 33 and one coil of second pair of coils 35 form a coil pair that enclosed center cavity 3 in order to generate the magnetic field required in center cavity 3. In particular in the specific development shown in FIG. 9, which has a hemispherical heat-dissipating surface 13, or one that is developed as spherical cup, the diffusion model employed for calculating the incoming and discharged heat flow as well as the temperature of the surface of component 41 to be cooled and heat-dissipating surface 13 and also the absorbed thermal energy, is generally spherically symmetrical.

What is claimed is:

1. A method for cooling a component using a device including a housing having a cavity formed therein in which a phase-change material is situated, the housing having at least one surface which is able to be brought into contact with the component to be cooled, and having at least one heat-dissipating surface, the device further including at least one coil enclosing the cavity accommodating the phase-change material, the phase-change material including at least one of ferromagnetic particles and magnetizable particles, the method comprising the following steps:
    (a) generating a magnetic field in the phase-change material by energizing the coils;
    (b) melting a portion of the phase-change material by absorption of heat on a side facing the component to be cooled;
    (c) reversing the magnetic field by reversing a direction of the energization of the coils and rotating a portion of the phase-change material that has not melted, which causes molten phase-change material to be moved toward the heat-dissipating surface and solid phase-change material to be moved to the surface at which the heat is absorbed, the solid phase-changing material being in contact with the cavity; and
    (d) melting a portion of the solid phase-change material facing the component to be cooled, and orientated solidification of liquid phase-change material facing the heat-dissipating surface in the magnetic field of the coils.

2. The method as recited in claim 1, further comprising: determining supplied or discharged heat flow and absorbed or dissipated heat quantity from a change in magnetization of the at least one of the ferromagnetic particles and magnetizable particles contained in the phase-change material caused by the phase change.

3. The method as recited in claim 2, wherein the change in the magnetization is determined from a change in inductivities of the coils.

4. The method as recited in claim 2, further comprising: determining at which frequency the magnetic field is reversed based on the supplied or discharged heat flow and the absorbed or dissipated heat quantity.

* * * * *